(12) United States Patent  
Fayrushin et al.

(10) Patent No.: US 7,842,570 B2
(45) Date of Patent: Nov. 30, 2010

(54) SEMICONDUCTOR MEMORY DEVICES AND METHODS OF MANUFACTURING THE SAME

(75) Inventors: Albert Fayrushin, Gyeonggi-do (KR); Byung-Yong Choi, Seoul (KR); Choong-Ho Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 194 days.

(21) Appl. No.: 12/137,976

(22) Filed: Jun. 12, 2008

(65) Prior Publication Data

US 2009/0008700 A1 Jan. 8, 2009

(30) Foreign Application Priority Data

Jun. 14, 2007 (KR) ...................... 10-2007-0058235

(51) Int. Cl.
*H01L 21/336* (2006.01)
(52) U.S. Cl. ........................ 438/257; 438/201; 438/258; 438/261; 438/264; 438/266; 257/E21.422; 257/E21.682
(58) Field of Classification Search ........................ None
See application file for complete search history.

(56) References Cited

U.S. PATENT DOCUMENTS 6,034,395 A 3/2000 Tripsas et al.

6,927,447 B2 * 8/2005 Choi et al. .................. 257/315
6,933,198 B2 * 8/2005 Chu et al. ................... 438/266
2005/0116279 A1 * 6/2005 Koh ........................... 257/314

FOREIGN PATENT DOCUMENTS

| JP | 10-022403 | 1/1998 |
| JP | 2006-237434 | 9/2006 |
| KR | 1020020050918 A | 6/2002 |
| KR | 655289 | 12/2006 |
| KR | 1020060124863 A | 12/2006 |

OTHER PUBLICATIONS

Korean Notice to Submit Response; Mar. 27, 2008.

* cited by examiner

*Primary Examiner*—N Drew Richards
*Assistant Examiner*—Kyoung Lee
(74) *Attorney, Agent, or Firm*—Myers Bigel Sibley & Sajovec

(57) ABSTRACT

In methods of manufacturing a memory device, a tunnel insulation layer is formed on a substrate. A floating gate having a substantially uniform thickness is formed on the tunnel insulation layer. A dielectric layer is formed on the floating gate. A control gate is formed on the dielectric layer. A flash memory device including the floating gate may have more uniform operating characteristics.

15 Claims, 16 Drawing Sheets

SEMICONDUCTOR MEMORY DEVICES AND METHODS OF MANUFACTURING THE SAME

CROSS-REFERENCE TO RELATED APPLICATION

This application claims priority under 35 U.S.C. §119 to Korean Patent Application No. 2007-58235, filed on Jun. 14, 2007 in the Korean Intellectual Property Office (KIPO), the disclosure of which is incorporated by herein by reference in its entirety.

BACKGROUND

1. Field of the Invention

The present invention relates to semiconductor memory devices and methods of manufacturing the same. More particularly, embodiments of the present invention relate to flash memory devices including floating gates and methods of manufacturing the same.

2. Description of the Related Art

Semiconductor memory devices are divided into volatile memory devices and nonvolatile memory devices. Volatile memory devices, such as dynamic random access memory (DRAM) devices or static random access memory (SRAM) devices, lose data when supply power is interrupted. However, an input/output speed of data for such devices is fast. Non-volatile memory devices, such as read only memory (ROM) devices, do not lose data when supply power is interrupted. However, the input/output speed of data in such devices is relatively slow. Among the ROM devices, electrically erasable and programmable read only memory (EEPROM) devices, particularly, flash memory devices have been used widely.

A unit cell of a flash memory device has a gate structure including a floating gate. In particular, the gate structure of the flash memory device has a stacked structure in which a floating gate, a dielectric layer and a control gate are sequentially stacked on a tunnel insulation layer.

Examples of methods of manufacturing flash memory devices are disclosed in Korean Laid-Open Patent Publication No. 2004-005230, U.S. Pat. No. 6,743,675, etc. A method of manufacturing a flash memory device disclosed in the above documents is illustrated with reference to FIGS. 1A to 1I.

Referring to FIG. 1A, a pad oxide layer 110 and a pad nitride layer 120 are formed on a substrate 100.

Referring to FIG. 1B, an upper portion of the substrate 100 is partially etched using the pad nitride layer 120 and the pad oxide layer 110 as an etching mask, so that a trench 105 is formed to divide the substrate 100 into an active region and a field region.

Referring to FIG. 1C, an isolation layer 130 is formed on the substrate 100, the pad oxide layer 110 and the pad nitride layer 120 to fill up the trench 105 using undoped silicate glass (USG) oxide or high-density plasma (HDP) oxide.

Referring to FIG. 1D, the pad nitride layer 120 is removed by a stripping process, and the pad oxide layer 110 is removed by a wet etching process, thereby forming an opening 135 partially exposing the substrate 100. The stripping process and the wet etching process are performed in an isotropic direction using phosphoric acid solution and fluoride acid solution, respectively. During the stripping process and the wet etching process, a portion of the isolation layer 130 is also removed, so that the opening 135 has a peripheral portion having a depth greater than that of a central portion thereof.

Referring to FIG. 1E, a tunnel insulation layer 140 is formed on the active region of the substrate 100 exposed by the opening 135. Additionally, a floating gate layer 150 is formed on the tunnel insulation layer 140, a sidewall of the opening 135 and the isolation layer 130 using polysilicon. A sacrificial layer 170 is formed on the floating gate layer 150 using USG oxide to fill up the opening 135.

Referring to FIG. 1F, an upper portion of the sacrificial layer 170 and an upper portion of the floating gate layer 150 are removed to expose the isolation layer 130. Thus, the sacrificial layer 170 and the floating gate layer 150 are transformed into a sacrificial layer pattern 172 and a preliminary floating gate 152, respectively.

Referring to FIG. 1G, an upper portion of the preliminary floating gate 152 are removed by an anisotropic etching process to form a floating gate 154. The floating gate 154 is formed to have a peripheral portion having a thickness greater than that of a central portion thereof.

Referring to FIG. 1H, the sacrificial layer pattern 172 is removed, and an upper portion of the isolation layer 130 is removed so that the isolation layer 130 has a height substantially the same as that of the peripheral portion of the floating gate 154.

Referring to FIG. 1I, a dielectric layer 180 and a control gate 190 are formed on the floating gate 154 and the isolation layer 130, thereby forming the flash memory device.

In the method of manufacturing a flash memory device described above, when the pad nitride layer 120 and the pad oxide layer 110 are removed, the opening 135 has a peripheral portion having a depth greater than that of the central portion thereof. Thus, in the case of the floating gate 154 that is formed by partially removing the floating gate layer 150 on the active region of the substrate 100 exposed by the opening 135, the peripheral portion thereof has a thickness greater than that of the central portion thereof, and thus the floating gate 154 may not have a uniform thickness. Due to the non-uniformity of the thickness of the floating gate 154, the floating gate coupling between adjacent floating gates 154 on neighboring bit lines may not be uniform, and thus a unit cell of the flash memory device including the floating gate 154 may not have uniform operating characteristics.

SUMMARY

Embodiments of the present invention may provide memory devices including a floating gate having uniform thickness. Furthermore, embodiments of the present invention may provide methods of manufacturing memory devices including a floating gate having uniform thickness.

A semiconductor memory device according to some embodiments includes a tunnel insulation layer on a substrate, a floating gate on the tunnel insulation layer, a dielectric layer on the floating gate, and a control gate on the dielectric layer. The floating gate has a substantially uniform thickness.

The floating gate may have a peripheral portion having a height greater than that of a central portion thereof.

The substrate may include a plurality of active regions that vertically protrude away from a plane on which the substrate is placed, and may further include an isolation layer between the active regions.

The tunnel insulation layer may be over the active region and a portion of the floating gate may be over the isolation layer.

The memory device may further include an oxide layer on a sidewall of the protruded active region.

Methods of manufacturing a semiconductor memory device according to some embodiments include forming a tunnel insulation layer on a substrate, forming a floating gate having a substantially uniform thickness on the tunnel insulation layer, forming a dielectric layer on the floating gate, and forming a control gate on the dielectric layer.

Forming the floating gate may include forming a preliminary floating gate pattern on the tunnel insulation layer and removing a portion of the preliminary floating gate pattern by an isotropic etching process.

The methods may further include forming an etch stop layer pattern on the preliminary floating gate pattern before removing the portion of the preliminary floating gate pattern.

The methods may further include removing the etch stop layer pattern after removing the portion of the preliminary floating gate pattern.

The methods may further include forming an isolation layer in the substrate adjacent an active region in the substrate, and forming the preliminary floating gate pattern may include forming a preliminary floating gate layer on the active region and on the isolation layer, forming an etch stop layer on the preliminary floating gate layer, forming a sacrificial layer on the etch stop layer, and removing portions of the sacrificial layer, the etch stop layer and the preliminary floating gate layer to expose the isolation layer and to form a sacrificial layer pattern and the preliminary floating gate pattern on the etch stop layer pattern.

The methods may further include removing the sacrificial layer pattern to expose the etch stop layer pattern, and removing a portion of the isolation layer until a top surface of the isolation layer has a height substantially the same as a height of a lowermost portion of the etch stop layer pattern.

The methods may further include forming a second sacrificial layer pattern on the etch stop layer pattern after removing the portion of the isolation layer and after removing the portion of the preliminary floating gate.

The methods may further include etching the second sacrificial layer pattern to expose the etch stop layer pattern, and etching the isolation layer until the top surface of the isolation layer has a height substantially the same as a top surface of a peripheral portion of the floating gate.

The methods may further include removing the etch stop layer pattern after etching the second sacrificial layer pattern.

The methods may further include removing the sacrificial layer pattern to expose the etch stop layer pattern, and removing a portion of the isolation layer until a top surface of the isolation layer has a height substantially the same as a height of a lowermost portion of the preliminary floating gate pattern.

The methods may further include forming a silicon oxide layer on a sidewall of the trench, and forming the opening may include removing a portion of the silicon oxide layer.

The methods may further include removing an upper portion of the isolation layer after forming the etch stop layer pattern to partially expose the preliminary floating gate.

Removing the upper portion of the isolation layer may include removing the upper portion of the isolation layer until a top surface of the isolation layer has a height substantially the same as that of a lowermost point of the etch stop layer pattern.

Removing the upper portion of the isolation layer may include removing the upper portion of the isolation layer until a top surface of the isolation layer has a height substantially the same as or higher than that of a lowermost point of the preliminary floating gate.

In some embodiments, prior to forming the tunnel insulation layer, a pad layer pattern and a mask may be formed on the substrate. An upper portion of the substrate may be removed using the pad layer pattern and the mask as an etching mask to form a trench defining an active region vertically protruded from a plane on which the substrate is placed. An isolation layer filling up the trench is formed. An opening exposing the active region is formed by removing the mask and the pad layer pattern. The tunnel insulation layer may be formed on the exposed active region.

In some embodiments, the mask may be removed by a stripping process or a wet etching process, and the pad layer pattern may be removed by a wet etching process.

In some embodiments, the mask may be formed using silicon nitride, the pad layer pattern may be formed using silicon oxide, and the isolation layer may be formed using silicon oxide or an HDP oxide.

In some embodiments, when the opening is formed, a portion of the isolation layer may be removed. In some embodiments, the opening may have a peripheral portion having a depth lower than that of a central portion thereof.

In some embodiments, the preliminary floating gate may be formed on a bottom and a sidewall of the opening.

Methods of manufacturing a semiconductor memory device according to further embodiments include forming an isolation layer in a substrate adjacent an active region in the substrate, forming a tunnel insulation layer on the active region, and forming a preliminary floating gate layer on the tunnel insulation layer and on the isolation layer. The methods further include forming an etch stop layer on the preliminary floating gate layer, forming a sacrificial layer on the etch stop layer, and removing portions of the sacrificial layer, the etch stop layer and the preliminary floating gate layer to expose the isolation layer and to form a preliminary floating gate pattern on the tunnel insulation layer. The preliminary floating gate pattern is isotropically etched to form a floating gate having a substantially uniform thickness. The methods further include removing the etch stop layer, forming a dielectric layer on the floating gate, and forming a control gate on the dielectric layer.

BRIEF DESCRIPTION OF THE DRAWINGS

The above and other features and advantages of the present invention will become more apparent by describing in detailed example embodiments thereof with reference to the accompanying drawings, in which.

DETAILED DESCRIPTION

Figure 1A:
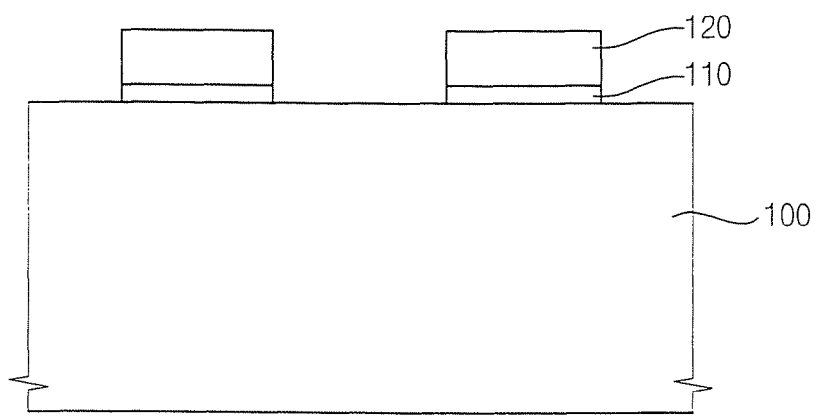
FIGS. 1A to 1I are cross-sectional views illustrating a conventional method of manufacturing a flash memory device.
Figure 1B:
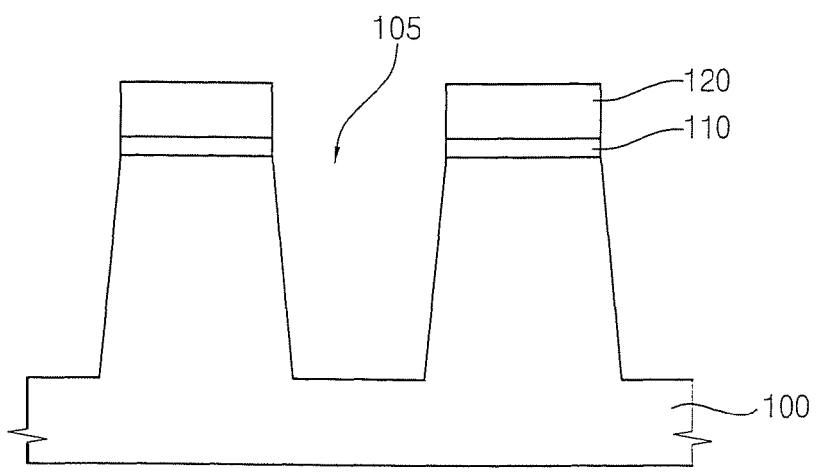
Figure 1C:
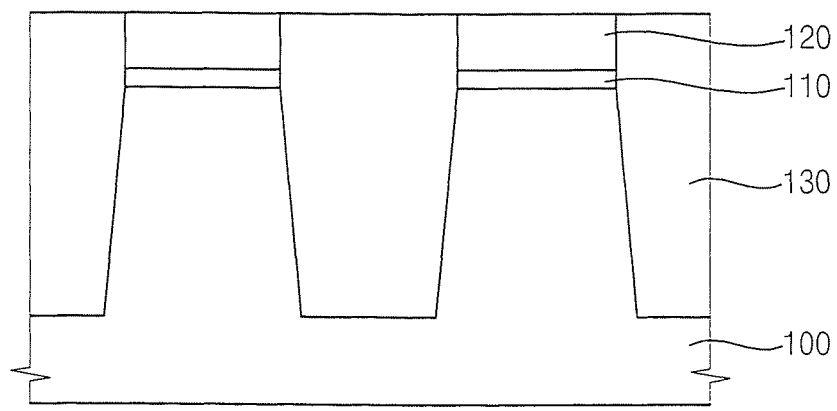
Figure 1D:
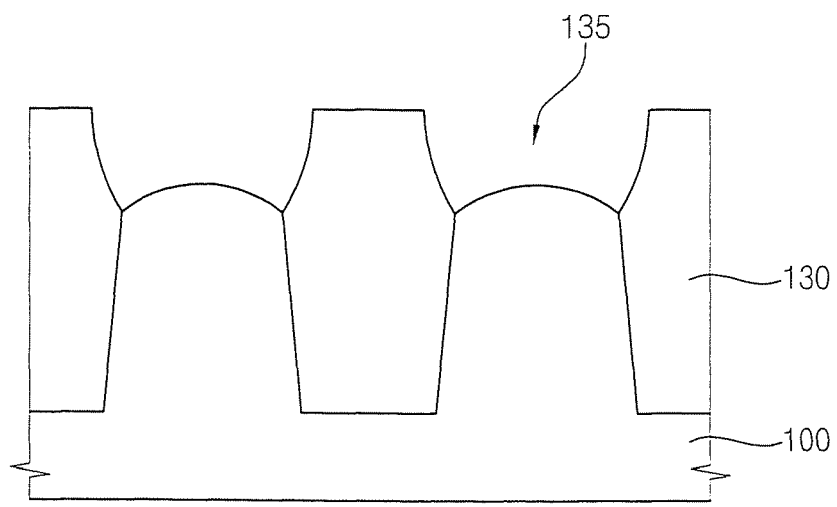
Figure 1E:
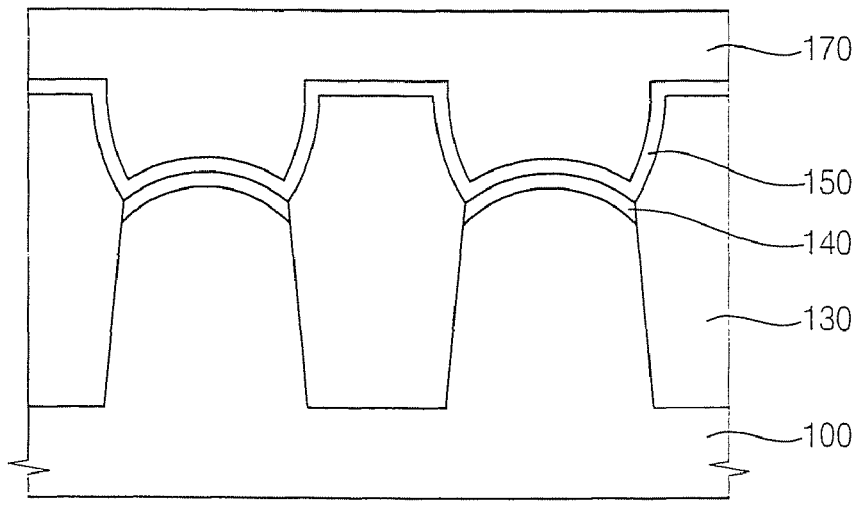
Figure 1F:
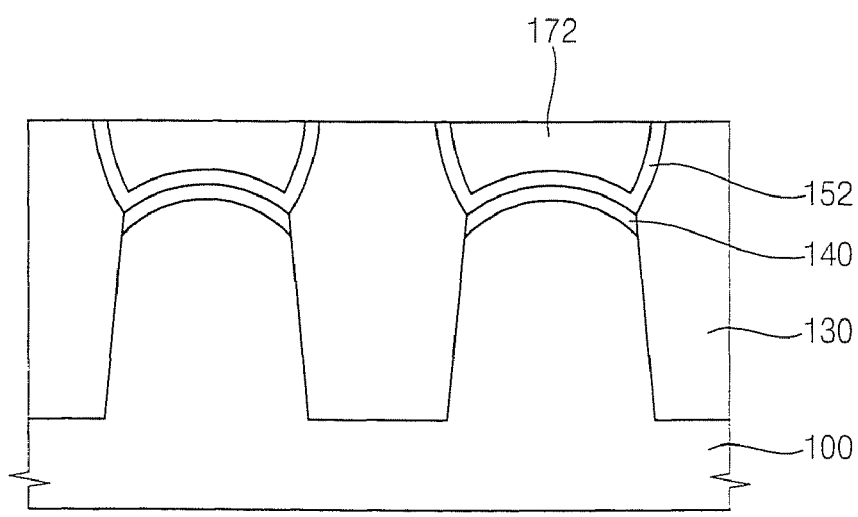
Figure 1G:
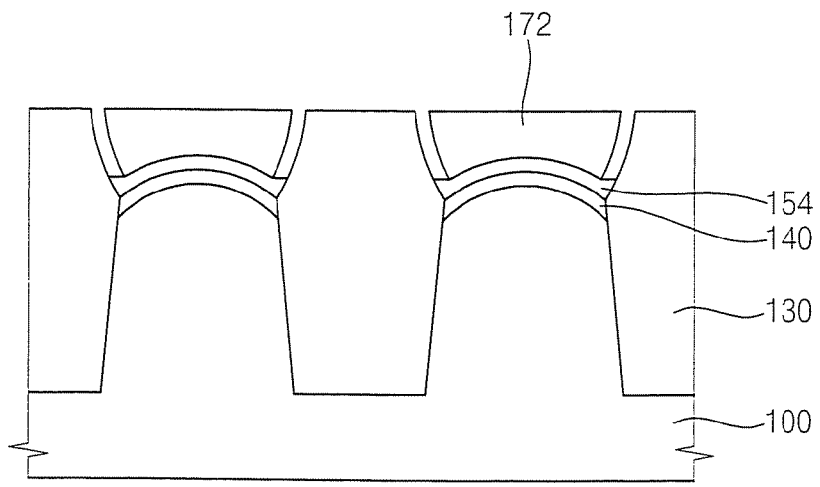
Figure 1H:
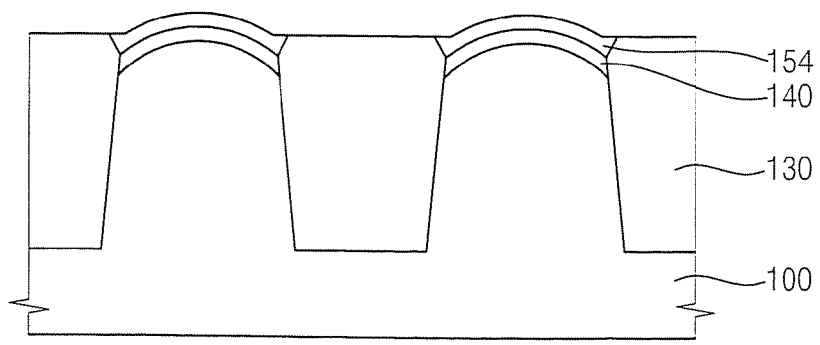
Figure 1I:
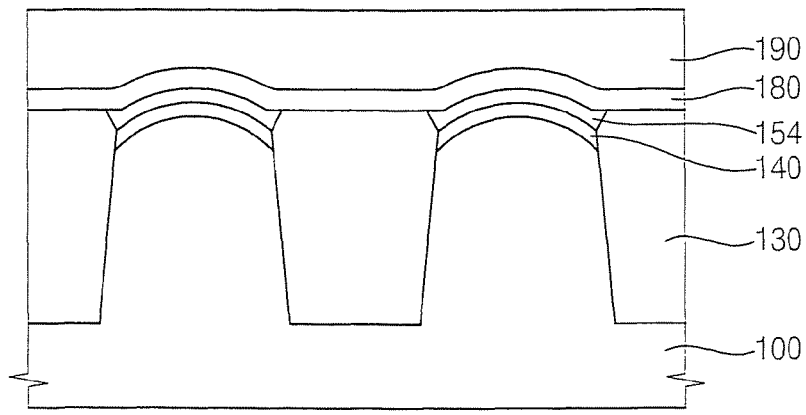

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Hereinafter, the present invention will be explained in detail with reference to the accompanying drawings.

Figure 2:
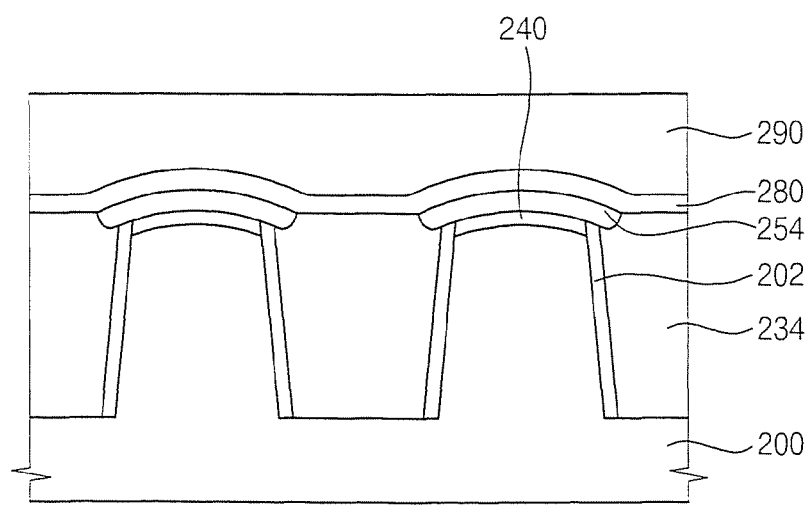
FIG. 2 is a cross-sectional view illustrating a non-volatile memory device in accordance with some embodiments.

FIG. 2 is a cross-sectional view illustrating a non-volatile memory device in accordance with some embodiments.

Referring to FIG. 2, a non-volatile memory device according to some embodiments includes a tunnel insulation layer 240, a first floating gate 254, a dielectric layer 280 and a control gate 290 on a substrate 200.

The substrate 200 may include a silicon substrate, a germanium substrate, a silicon-on-insulator (SOI) substrate, a germanium-on-insulator (GOI) substrate, etc. The substrate 200 may be divided into an active region and a field region. The active region may have a shape vertically protruded from a plane on which the substrate 200 is placed.

The tunnel insulation layer 240 is formed on the active region. The tunnel insulation layer 240 may be formed by performing a thermal oxidation process on a top surface of the active region.

A first isolation layer 234 is formed on the field region between the active regions. The first isolation layer 234 may include USG oxide, $O_3$-Tetra Ethyl Ortho Silicate Undoped Silicate Glass ($O_3$-TEOS) oxide, HDP oxide, etc.

An oxide layer 202 is formed on a sidewall of the active region making contact with the isolation layer 234. The oxide layer 202 may be formed by thermally oxidizing the sidewall of the active region. Alternatively, the oxide layer 202 may not be formed.

The first floating gate 254 is formed on the tunnel insulation layer 240 and the oxide layer 202. Additionally, the first floating gate 254 may be formed on a portion of the isolation layer 234. In some embodiments, the first floating gate 254 has a peripheral portion having a height lower than that of a central portion thereof. The first floating gate 254 may include polysilicon and/or doped polysilicon.

The first floating gate 254 may have a substantially uniform thickness. Thus, the floating gate coupling between the adjacent first floating gates 254 on neighboring bit lines (not shown) may be more uniform, and the non-volatile memory device including the first floating gate 254 may have more uniform operating characteristics.

The dielectric layer 280 is formed on the first floating gate 254 and the isolation layer 234. The dielectric layer 280 may include a high-k material, and may have a multi-stack structure including an oxide layer/nitride layer/oxide layer structure.

The control gate 290 is formed on the dielectric layer 280. The control gate 290 may include doped polysilicon and/or a metal silicide. Examples of the metal silicide may include tungsten silicide ($WSi_x$), titanium silicide ($TiSi_x$), cobalt silicide ($CoSi_x$), tantalum silicide ($TaSi_x$), etc.

Figure 3:
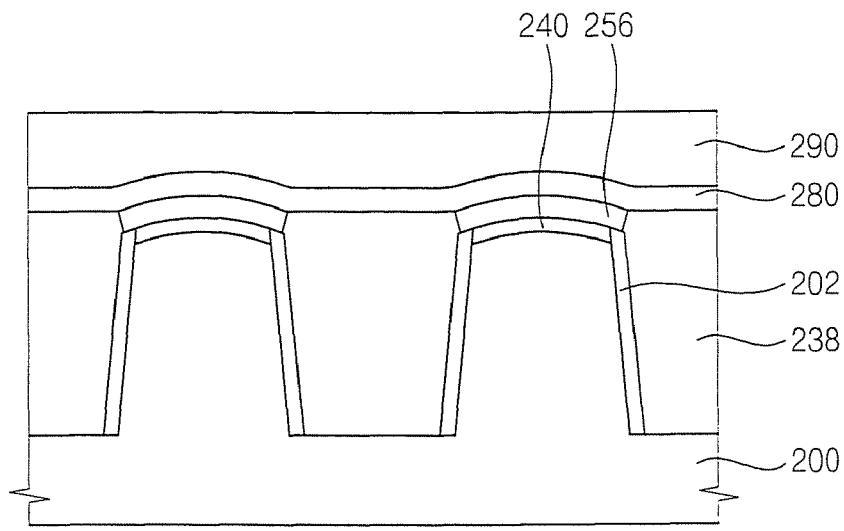
FIG. 3 is a cross-sectional view illustrating a non-volatile memory device in accordance with some embodiments.

FIG. 3 is a cross-sectional view illustrating a non-volatile memory device in accordance with some other embodiments. The non-volatile memory device in FIG. 3 is substantially the same as or very similar to that illustrated in FIG. 2, except the non-volatile memory device in FIG. 3 has a second floating gate 256 instead of the first floating gate 254. Thus, only the second floating gate 256 is illustrated herein in order to avoid repetitions.

Referring to FIG. 3, the second floating gate 256 is formed on the tunnel insulation layer 240 and the oxide layer 202. The second floating gate 256 is not substantially formed over the second isolation layer 238. In some embodiments, the second floating gate 256 has a peripheral portion having a height lower than that of a central portion thereof. The second floating gate 256 may include polysilicon and/or doped polysilicon.

The second floating gate 256 has a substantially uniform thickness like the first floating gate 254. Thus, the floating gate coupling between the adjacent second floating gates 256 on neighboring bit lines (not shown) may be more uniform, and the non-volatile memory device including the second floating gate 256 may have more uniform operating characteristics.

Figure 4A:
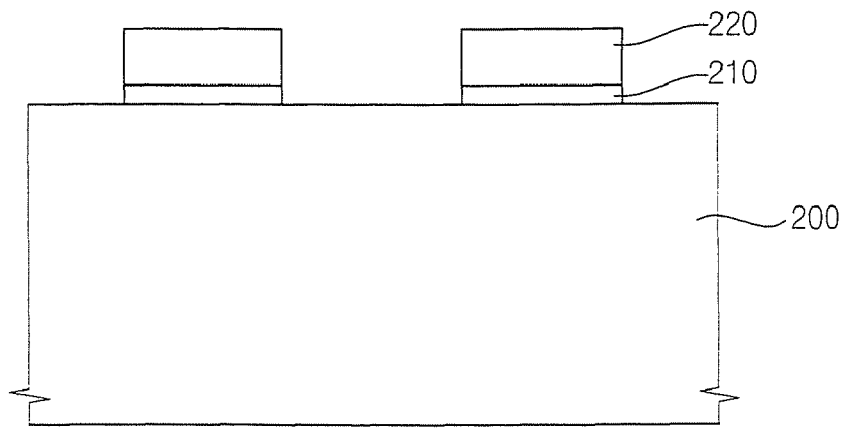
FIGS. 4A to 4N are cross-sectional views illustrating methods of manufacturing a non-volatile memory device in accordance with some embodiments.
Figure 4B:
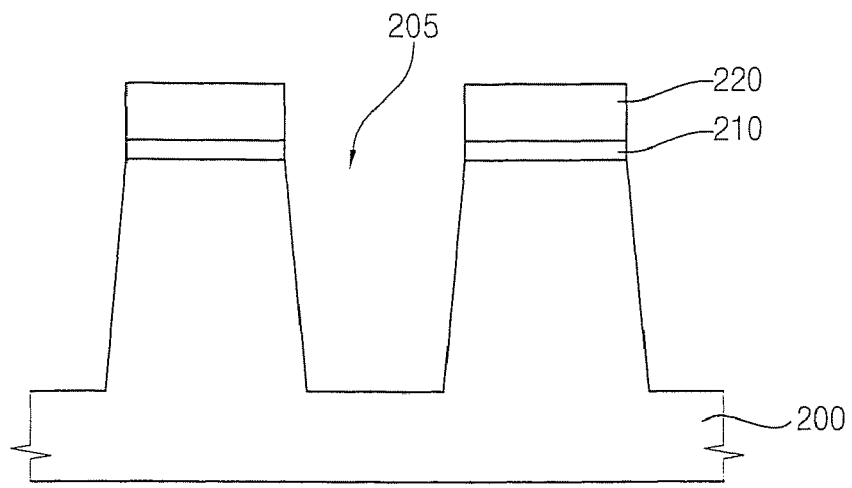
Figure 4C:
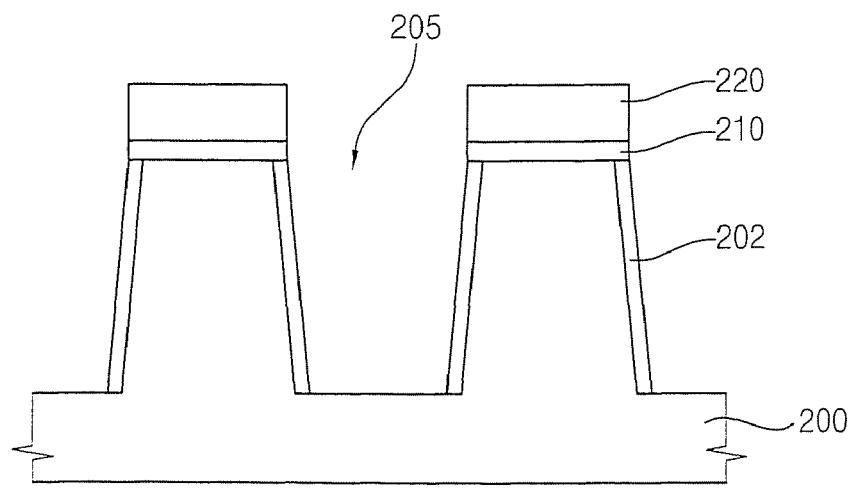
Figure 4D:
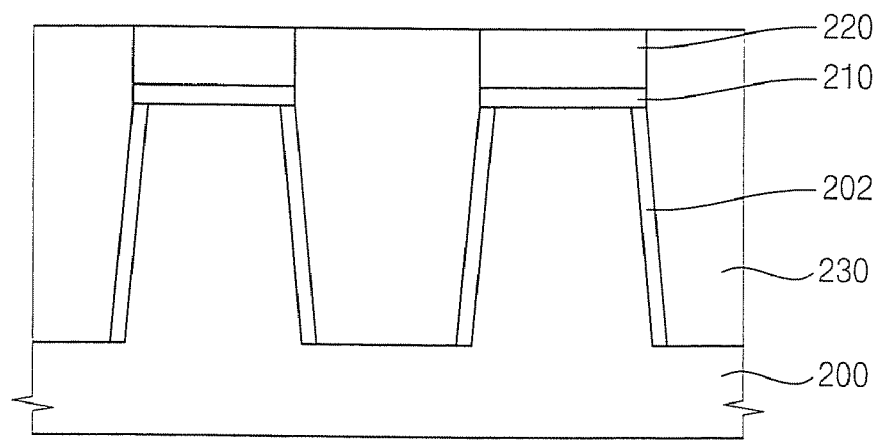
Figure 4E:
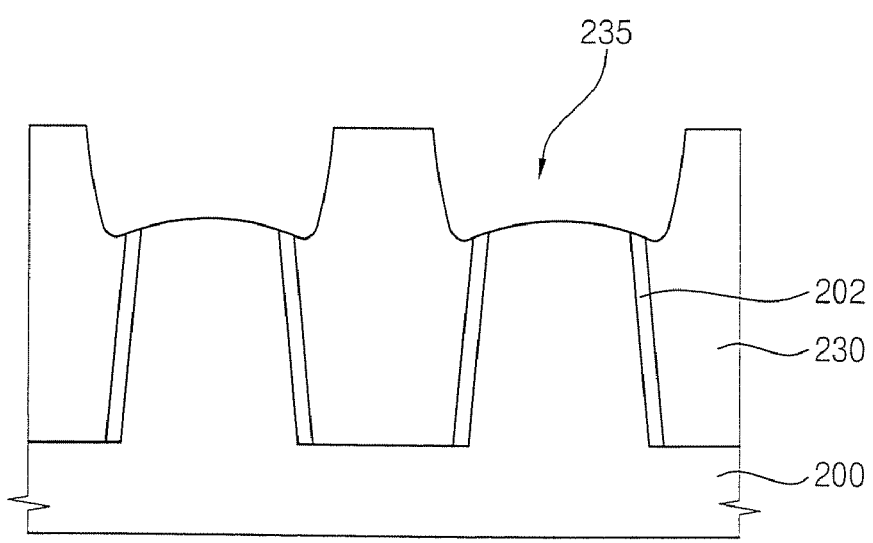
Figure 4F:
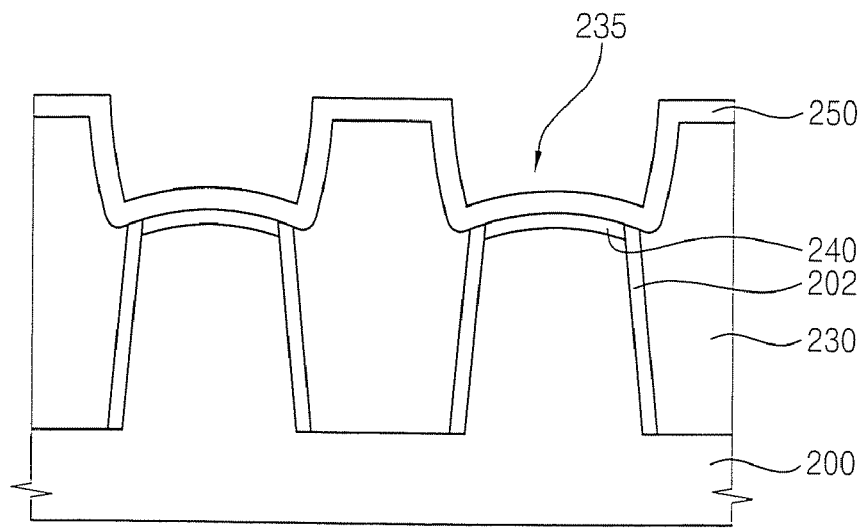
Figure 4G:
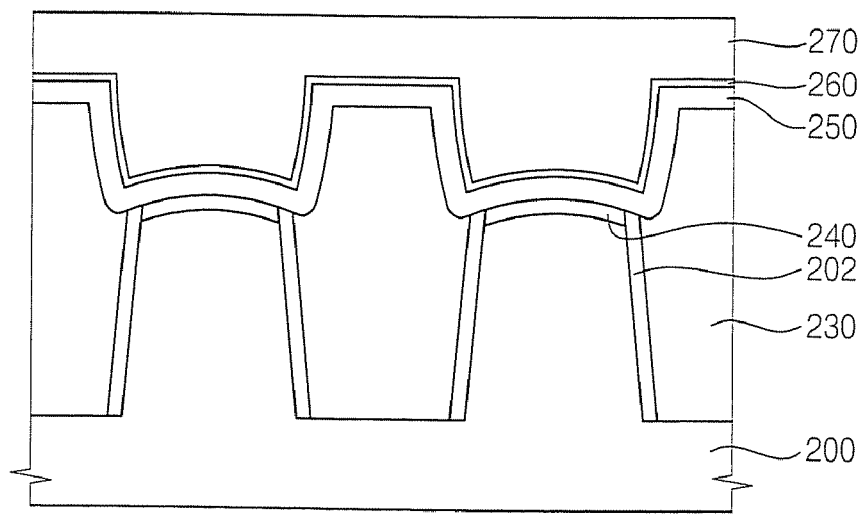
Figure 4H:
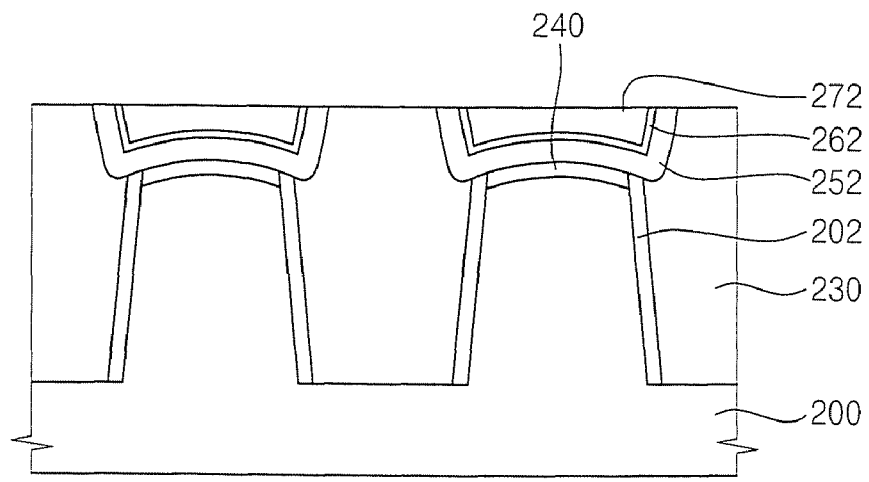
Figure 4I:
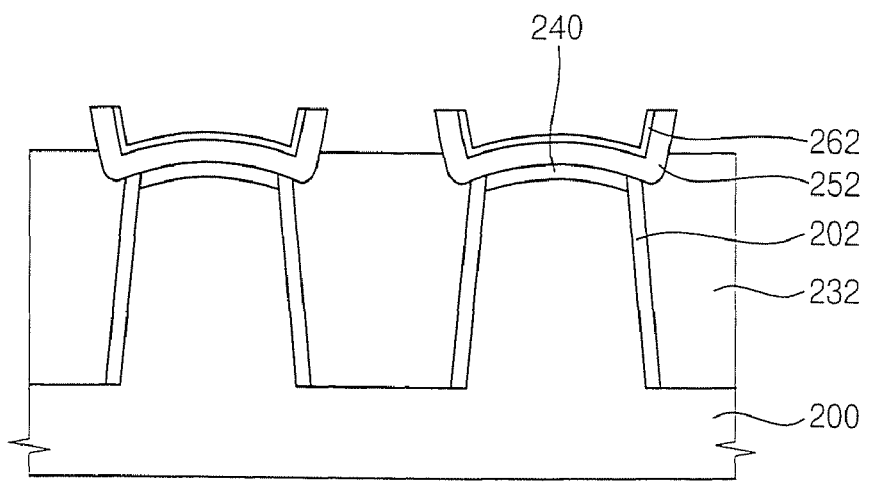
Figure 4J:
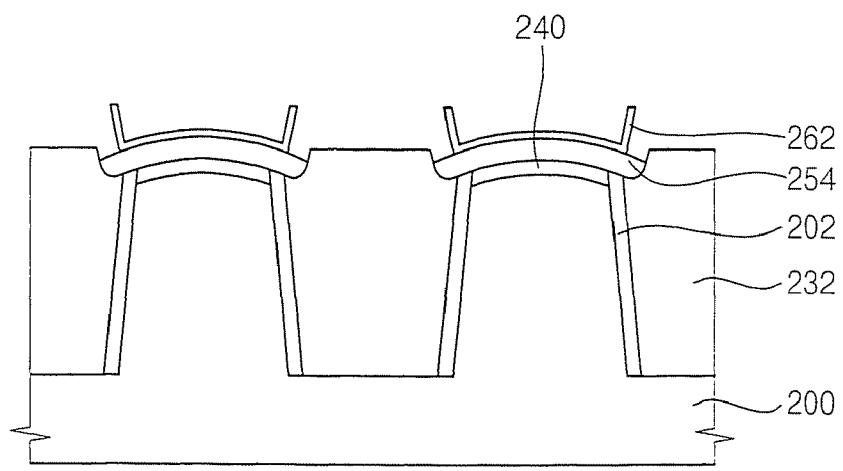
Figure 4K:
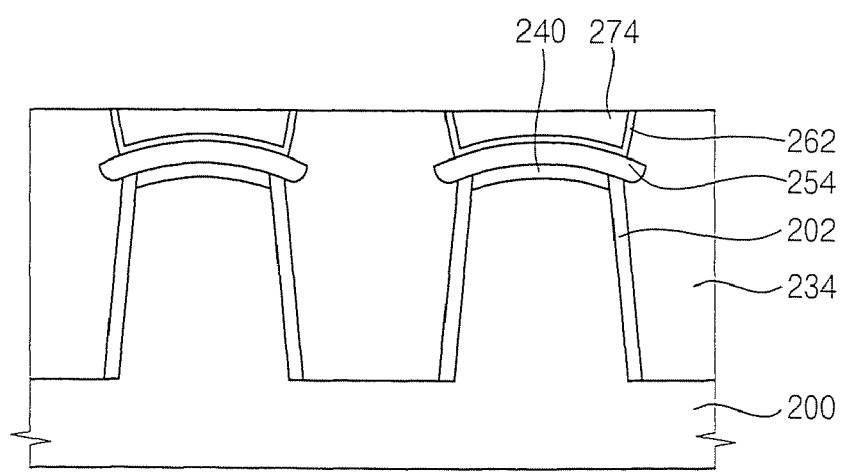
Figure 4L:
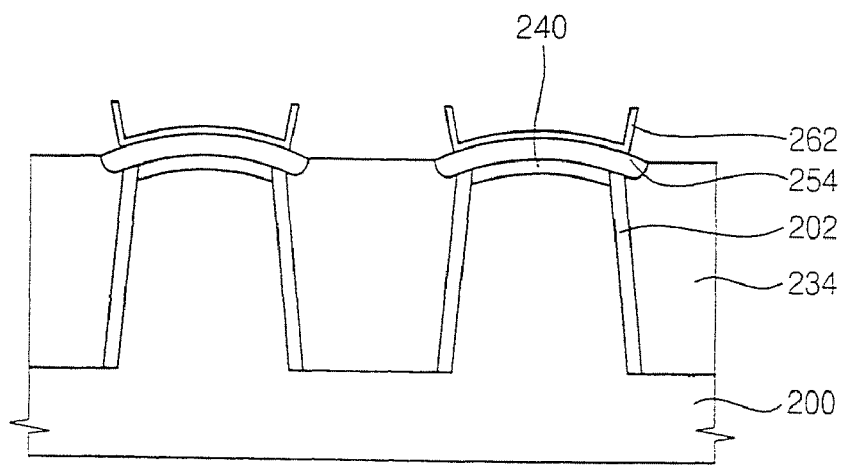
Figure 4M:
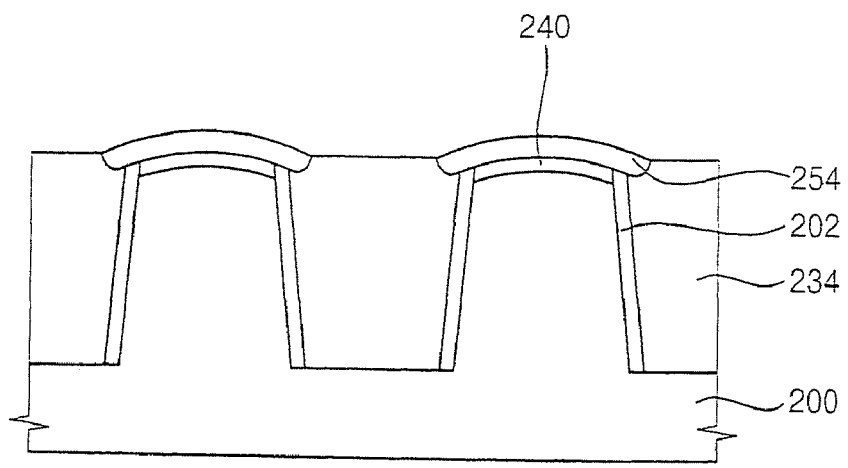
Figure 4N:
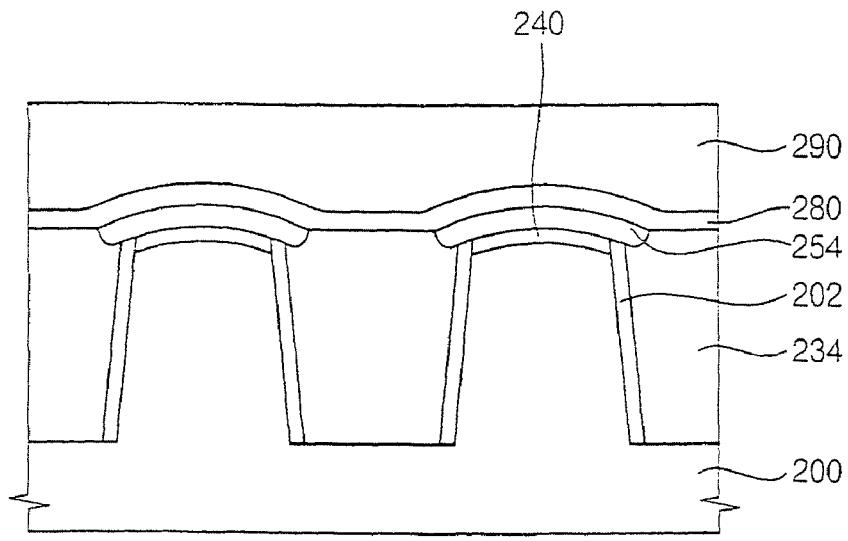

FIGS. 4A to 4N are cross-sectional views illustrating methods of manufacturing non-volatile memory devices in accordance with some embodiments.

Referring to FIG. 4A, a pad layer and a mask layer are formed on a substrate 200. The substrate 200 may include a silicon substrate, a germanium substrate, a SOI substrate, a GOI substrate, etc. The substrate 200 may be divided into an active region and a field region. The pad layer may be formed by thermally oxidizing a top surface of the substrate 200. The pad layer may reduce or prevent crystal defects from being generated at the top surface of the substrate 200, and/or may reduce stress generated due to the direct contact between the top surface of the substrate 200 and the mask layer. The mask layer may be formed using a low pressure chemical vapor deposition (LPCVD) process using a nitride. An anti-reflective layer (not shown) may be further formed on the mask layer, so that a photoresist pattern (not shown) may keep a good vertical profile even after performing a photolithography process.

The photoresist pattern is formed on the mask layer to cover the active region of the substrate 200 and expose the field region of the substrate 200. The mask layer and the pad layer are partially etched by an etching process using the photoresist pattern as an etching mask, thereby forming a pad layer pattern 210 and a mask 220 sequentially stacked on the active region of the substrate 200. The photoresist pattern may be removed by an ashing process and/or a stripping process.

Referring to FIG. 4B, an upper portion of the field region of the substrate 200 is partially removed by a dry etch process using the mask 220 and the pad layer pattern 210 as an etching mask, thereby forming a trench 205.

Referring to FIG. 4C, an oxide layer 202 may be formed on a sidewall of the trench 205, so that damages to the sidewall of the trench 205 generated during the dry etch process may be at least partially cured. The oxide layer 202 may be formed by thermally oxidizing the sidewall of the trench 205. Alternatively, the oxide layer 202 may not be formed.

A liner (not shown) may be further formed on a bottom of the trench 205, the oxide layer 202, the pad layer pattern 210 and the mask 220. The liner may be formed using silicon nitride. The liner may enhance the adhesion of a first preliminary isolation layer 230 to the trench 205, and to reduce or prevent a leakage current from flowing into the substrate 200.

Referring to FIG. 4D, the first preliminary isolation layer 230 is formed on the substrate 200 to fill up the trench 205. The first preliminary isolation layer 230 may be formed by a chemical vapor deposition (CVD) process using a material having good gap-filling characteristics such as USG oxide, $O_3$-TEOS oxide, HDP oxide, etc. Additionally, an annealing process may be performed at a temperature of about 800° C. to about 1050° C. under an atmosphere of an inert gas, so that the first preliminary isolation layer 230 may be densified and an etching rate thereof with respect to an etching solution used in a successive wet etching process may be reduced.

An upper portion of the first preliminary isolation layer 230 is planarized until the mask 220 is exposed by a chemical mechanical polishing (CMP) process, an etch-back process, or a combination process thereof.

Referring to FIG. 4E, the mask 220 is removed by a stripping process and/or a wet etching process. The stripping process and/or the wet etching process may be performed using phosphoric acid solution. Additionally, the pad layer pattern 210 may be removed by a wet etching process. The wet etching process may be performed using fluoride acid solution. Thus, an opening 235 exposing the active region of the substrate 200 is formed. The stripping process and the wet etching process are performed in an isotropic manner, and thus the first preliminary isolation layer 230 and the oxide layer 202 may be partially removed together with the mask 220 and the pad layer pattern 210. As a result, the opening 235 may have a peripheral portion having a depth greater than that of a central portion thereof.

Referring to FIG. 4F, a tunnel insulation layer 240 is formed on the active region of the substrate 200 exposed by the opening 235. The tunnel insulation layer 240 may be formed by thermally oxidizing a top surface of the substrate 200. Additionally, a floating gate layer 250 is formed on a bottom and a sidewall of the opening 235 and the first preliminary isolation layer 230. The floating gate layer 250 may be formed by deposing polysilicon and/or amorphous silicon and doping impurities thereinto.

Referring to FIG. 4G, an etch stop layer 260 is formed on the floating gate layer 250. The etch stop layer 260 may be formed using silicon nitride. The etch stop layer 260 may prevent a portion of the preliminary floating gate 252 (see FIG. 4I) on the active region from being etched when a floating gate 254 (see FIG. 4J) is successively formed. A sacrificial layer 270 is formed on the floating gate layer 250 to fill up the opening 235. The sacrificial layer 270 may be formed by a CVD process using boron silicate glass (BSG) oxide, USG oxide, middle temperature oxide (MTO), etc.

Referring to FIG. 4H, upper portions of the sacrificial layer 270, the etch stop layer 260 and the floating gate layer 250 are removed to expose the first preliminary isolation layer 230. Thus, the sacrificial layer 270, the etch stop layer 260 and the floating gate layer 250 may be transformed into a first sacrificial layer pattern 272, an etch stop layer pattern 262 and the preliminary floating gate 252, respectively. Meanwhile, in order to prevent the preliminary floating gate 252 from falling down due to the removal of a portion of the first preliminary isolation layer 230 in a successive process, an upper portion of the first preliminary isolation layer 230 may be also removed together with the sacrificial layer 270, the etch stop layer 260 and the floating gate layer 250 in the above process so that the preliminary floating gate 252 may have a reduced height. The upper portions of the sacrificial layer 270, the etch stop layer 260 and the floating gate layer 250 may be removed by a CMP process, an etch-back process, or a combination process thereof.

Referring to FIG. 4I, the first sacrificial layer pattern 272 is removed to expose the etch stop layer pattern 262. Additionally, an upper portion of the first preliminary isolation layer 230 is removed until a top surface of the first preliminary isolation layer 230 has a height substantially the same as that of the lowermost point of the etch stop layer pattern 262, so that an upper portion of the preliminary floating gate 252 is exposed. Thus, the first preliminary isolation layer 230 may be transformed into a second preliminary isolation layer 232. The first sacrificial layer pattern 272 and the upper portion of the first preliminary isolation layer 230 may be removed by a dry etch process.

Referring to FIG. 4J, the exposed upper portion of the preliminary floating gate 252 is removed by an isotropic etching process to form a first floating gate 254. The isotropic etching process may be performed by a wet etching process using standard clean-1 (SC-1) solution including ammonia, hydrogen peroxide and water, and/or by a chemical dry etch process. The upper portion of the preliminary floating gate 252 is etched not only in a vertical direction but also in a horizontal direction, so that a portion of the preliminary floating gate 252 under a plane extending from a top face of the second isolation layer 232 may be removed. Thus, the first floating gate 254 may have a uniform thickness regardless of a specific location. Meanwhile, a portion of the preliminary floating gate 252 covered by the etch stop layer pattern 262 is not removed.

Referring to FIG. 4K, a second sacrificial layer pattern 274 and a first isolation layer 234 are formed to cover the etch stop layer pattern 262, the first floating gate 254 and the second preliminary isolation layer 232. In some embodiments, the second sacrificial layer pattern 274 and the first isolation layer 234 are formed using a material substantially the same as that of the second preliminary isolation layer 232, and thus the first isolation layer 234 may contain the second preliminary isolation layer 232. That is, the second sacrificial layer pattern 274 and the first isolation layer 234 may be formed by a CVD process using USG oxide, $O_3$-TEOS oxide, HDP oxide, etc.

Referring to FIG. 4L, the second sacrificial layer pattern 274 is removed, and an upper portion of the first isolation layer 234 is removed until the first isolation layer 234 has a height substantially the same as that of a top surface of the peripheral portion of the first floating gate 254. The second sacrificial layer pattern 274 and the upper portion of the first isolation layer 234 may be removed by a dry etch process. In some embodiments, the process for forming the second sacrificial layer pattern 274 and the first isolation layer 234 may be omitted. In this case, an upper portion of the second preliminary isolation layer 232 may be removed until the second preliminary isolation layer 232 has a height substantially the same as that of the peripheral portion of the first floating gate 254, so that the first isolation layer 234 may be formed.

Referring to FIG. 4M, the etch stop layer pattern 262 is removed. The etch stop layer pattern 262 may be removed by a stripping process using phosphoric acid solution. In this case, an isotropic etching process may be further performed to smoothen a top surface of the first floating gate 254.

Referring to FIG. 4N, a dielectric layer 280 is formed on the first floating gate 254 and the first isolation layer 234. The dielectric layer 280 may be formed by a CVD process and/or an ALD process using a high-k material. The dielectric layer 280 may be formed to have a multi-stack structure including an oxide layer/nitride layer/oxide layer structure. A control gate 290 is formed on the dielectric layer 280. The control gate 290 may be formed using doped polysilicon and/or a metal silicide. These may be used alone or in a combination thereof. The metal silicide may include tungsten silicide ($WSi_x$), titanium silicide ($TiSi_x$), cobalt silicide ($CoSi_x$), tantalum silicide ($TaSi_x$), etc.

By performing the processes described above, a flash memory device including the tunnel insulation layer 240, the first floating gate 254, the dielectric layer 280 and the control gate 290 may be manufactured.

FIGS. 5A to 5F are cross-sectional views illustrating methods of manufacturing flash memory devices in accordance with further embodiments.

First, processes substantially the same as or very similar to those illustrated with reference to FIGS. 4A to 4H are performed, and then following processes illustrated with reference to FIGS. 5A to 5F are performed.

Figure 5A:
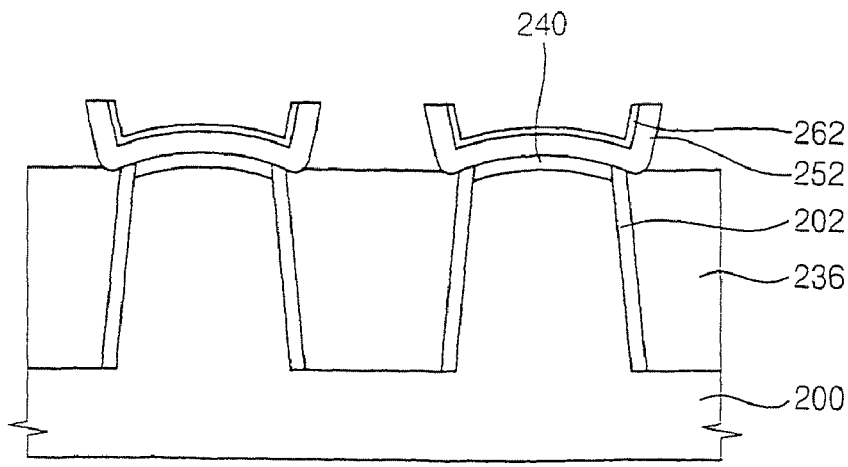
FIGS. 5A to 5F are cross-sectional views illustrating methods of manufacturing a flash memory device in accordance with some embodiments.

Referring to FIG. 5A, the first sacrificial layer pattern 272 is removed to expose the etch stop layer pattern 262. Additionally, an upper portion of the first preliminary isolation layer 230 is removed, so that a third preliminary isolation layer 236 having a height substantially the same as or higher than the lowermost point of the preliminary floating gate 252 may be formed from the first preliminary isolation layer 230, and a portion of the preliminary floating gate 252 is exposed. The first sacrificial layer pattern 272 and the upper portion of the first preliminary isolation layer 230 may be removed by a dry etch process.

Figure 5B:
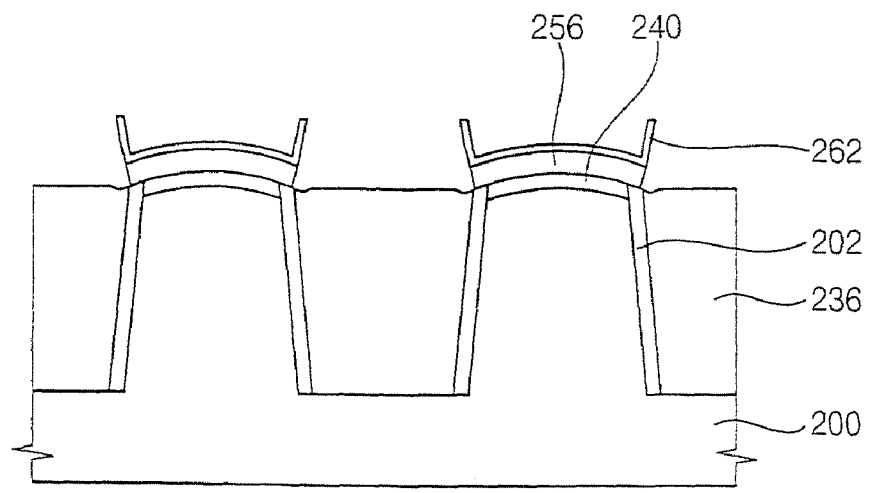

Referring to FIG. 5B, the exposed portion of the preliminary floating gate 252 is removed by an isotropic etching process to form a second floating gate 256. The isotropic etching process may be performed by a wet etching process using SC-1 solution including ammonia, hydrogen peroxide and water, or by a chemical dry etch process. The upper portion of the preliminary floating gate 252 is etched not only in a vertical direction but also in a horizontal direction, so that a portion of the preliminary floating gate 252 that has not been covered by the etch stop layer pattern 262 may be removed. Thus, the second floating gate 256 may have a uniform thickness regardless of a specific location. The first floating gate 254 shown in FIG. 4J has a portion that is exposed outwardly and simultaneously not covered by the etch stop layer pattern 262, while the second floating gate 256 in FIG. 5B does not have a portion that is exposed outwardly and simultaneously not covered by the etch stop layer pattern 262.

Figure 5C:
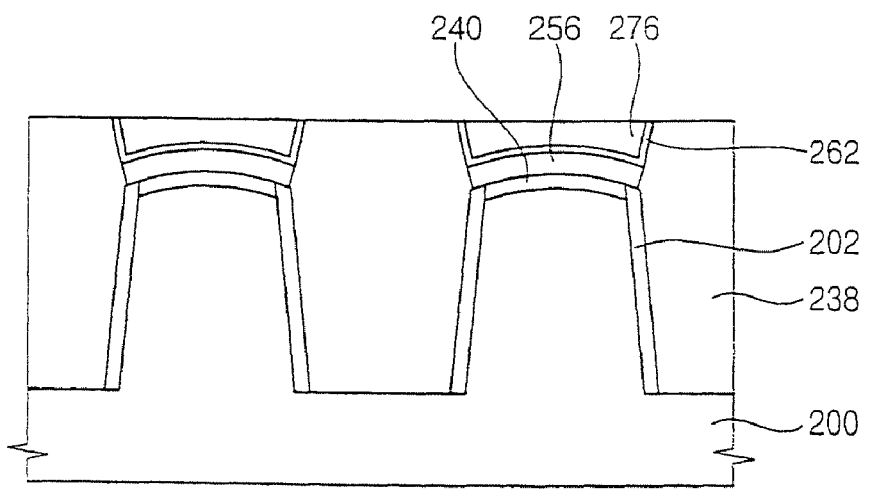

Referring to FIG. 5C, a third sacrificial layer pattern 276 and a second isolation layer 238 are formed to cover the etch stop layer pattern 262, the second floating gate 256 and the second preliminary isolation layer 232. In some embodiments, the third sacrificial layer pattern 276 and the second isolation layer 238 may be formed using a material substantially the same as that of the first preliminary isolation layer 232, and thus the second isolation layer 238 may contain the first preliminary isolation layer 232. That is, the third sacrificial layer pattern 276 and the second isolation layer 238 may be formed by a CVD process using USG oxide, $O_3$-TEOS oxide, HDP oxide, etc.

Figure 5D:
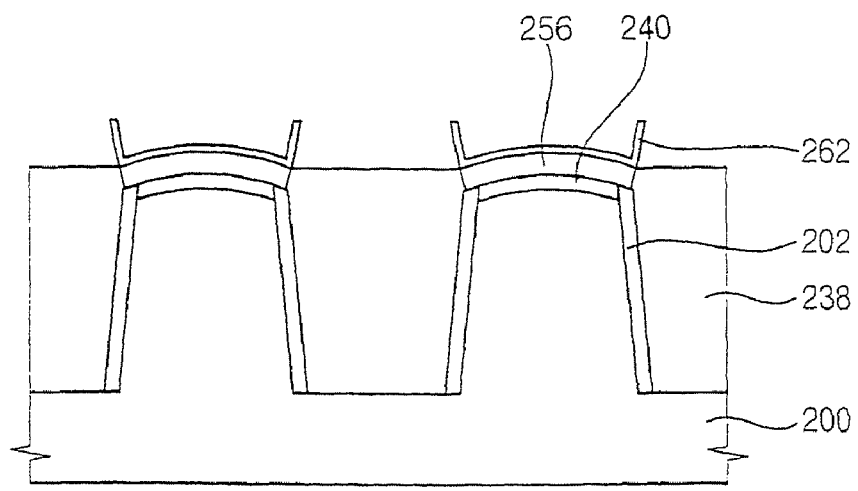

Referring to FIG. 5D, after removing the third sacrificial layer pattern 276, an upper portion of the second isolation layer 238 is removed until the second isolation layer 238 has a height substantially the same as that of a top surface of the peripheral portion of the second floating gate 256. The third sacrificial layer pattern 276 and the upper portion of the second isolation layer 238 may be removed by a dry etch process.

Figure 5E:
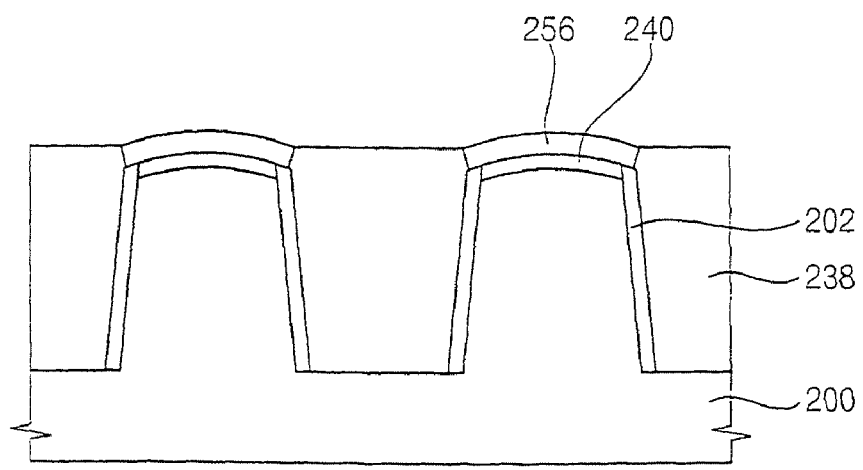

Referring to FIG. 5E, the etch stop layer pattern 262 is removed. The etch stop layer pattern 262 may be removed by a stripping process using phosphoric acid solution. An isotropic etching process may be further performed to smoothen a top surface of the second floating gate 256.

Figure 5F:
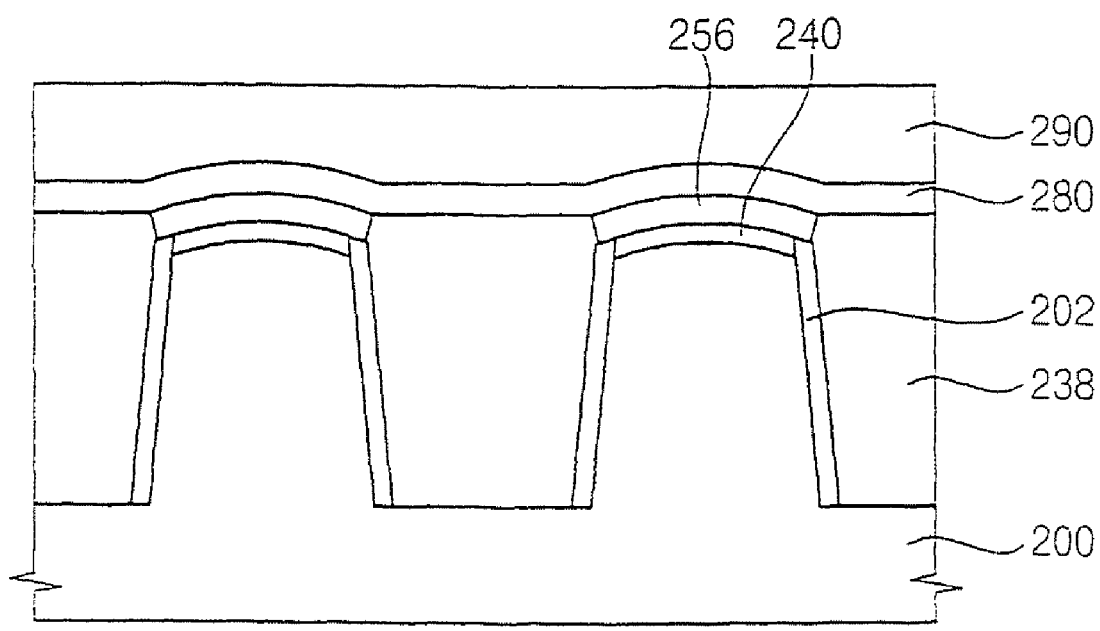

Referring to FIG. 5F, a dielectric layer 280 is formed on the second floating gate 256 and the second isolation layer 238, and a control gate 290 is formed on the dielectric layer 280.

By performing the processes described above, a flash memory device including the tunnel insulation layer 240, the second floating gate 256, the dielectric layer 280 and the control gate 290 may be manufactured.

According to some embodiments, when a floating gate is formed, after removing an upper portion of a preliminary isolation layer until a portion of a preliminary floating gate is exposed, the exposed portion of the preliminary floating gate may be removed by an isotropic etching process. Thus, the floating gate may have a more uniform thickness, and a flash memory device including the floating gate may have more uniform operating characteristics.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of manufacturing a semiconductor memory device, comprising:
    forming a tunnel insulation layer on a substrate;
    forming a floating gate having a substantially uniform thickness on the tunnel insulation layer;
    forming a dielectric layer on the floating gate;
    forming a control gate on the dielectric layer;
    forming a preliminary floating gate pattern on the tunnel insulation layer;
    forming an etch stop layer pattern on the preliminary floating gate pattern;
    forming an isolation layer in the substrate adjacent an active region in the substrate, and
    removing a portion of the isolation layer until a top surface of the isolation layer has a height substantially the same as a height of a lowermost portion of the etch stop layer pattern.

2. The method of claim 1, wherein forming the floating gate comprises:
    removing a portion of the preliminary floating gate pattern by an isotropic etching process.

3. The method of claim 2, further comprising forming the etch stop layer pattern on the preliminary floating gate pattern before removing the portion of the preliminary floating gate pattern.

4. The method of claim 3, further comprising removing the etch stop layer pattern after removing the portion of the preliminary floating gate pattern.

5. The method of claim 3, wherein forming the preliminary floating gate pattern comprises forming a preliminary floating gate layer on the active region and on the isolation layer, the method further comprising:
    forming an etch stop layer on the preliminary floating gate layer;
    forming a sacrificial layer on the etch stop layer; and
    removing portions of the sacrificial layer, the etch stop layer and the preliminary floating gate layer to expose the isolation layer and to form a sacrificial layer pattern and the preliminary floating gate pattern on the etch stop layer pattern.

6. The method of claim 5, further comprising:
    removing the sacrificial layer pattern to expose the etch stop layer pattern.

7. The method of claim 6, further comprising:
    forming a second sacrificial layer pattern on the etch stop layer pattern after removing the portion of the isolation layer and after removing the portion of the preliminary floating gate.

8. The method of claim 7, further comprising:
    etching the second sacrificial layer pattern to expose the etch stop layer pattern; and
    etching the isolation layer until the top surface of the isolation layer has a height substantially the same as a top surface of a peripheral portion of the floating gate.

9. The method of claim 8, further comprising:
    removing the etch stop layer pattern after etching the second sacrificial layer pattern.

10. A method of manufacturing a semiconductor memory device, comprising:
    forming a tunnel insulation layer on a substrate;
    forming a floating gate having a substantially uniform thickness on the tunnel insulation layer, wherein forming the floating gate comprises forming a preliminary floating gate pattern on the tunnel insulation layer and removing a portion of the preliminary floating gate pattern by an isotropic etching process;
    forming a dielectric layer on the floating gate;
    forming a control gate on the dielectric layer;
    forming an etch stop later pattern on the preliminary floating gate pattern before removing the portion of the preliminary floating gate pattern;
    forming an isolation layer in the substrate adjacent an active region in the substrate, wherein forming the preliminary floating gate pattern comprises forming a preliminary floating gate layer on the active region and on the isolation layer;
    forming an etch stop layer on the preliminary floating gate layer;
    forming a sacrificial layer on the etch stop layer;
    removing portions of the sacrificial layer, the etch stop layer and the preliminary floating gate layer to expose the isolation layer and to form a sacrificial layer pattern and the preliminary floating gate pattern on the etch stop layer pattern;
    removing the sacrificial layer pattern to expose the etch stop layer pattern; and
    removing a portion of the isolation layer until a top surface of the isolation layer has a height substantially the same as a height of a lowermost portion of the preliminary floating gate pattern.

11. A method of manufacturing a semiconductor memory device, comprising:
    forming a tunnel insulation layer on a substrate;
    forming a floating gate having a substantially uniform thickness on the tunnel insulation layer, wherein forming the floating gate comprises forming a preliminary floating gate pattern on the tunnel insulation layer and removing a portion of the preliminary floating gate pattern by an isotropic etching process;
    forming a dielectric layer on the floating gate;
    forming a control gate on the dielectric layer;
    forming an etch stop layer pattern on the preliminary floating gate pattern before removing the portion of the preliminary floating gate pattern;
    forming an isolation layer in the substrate adjacent an active region in the substrate, wherein forming the preliminary floating gate pattern comprises forming a preliminary floating gate layer on the active region and on the isolation layer;

forming an etch stop layer on the preliminary floating gate layer;

forming a sacrificial layer on the etch stop layer;

removing portions of the sacrificial layer, the etch stop layer and the preliminary floating gate layer to expose the isolation layer and to form a sacrificial layer pattern and the preliminary floating gate pattern on the etch stop layer pattern; and forming a silicon oxide layer on a sidewall of the trench, wherein forming the opening comprises removing a portion of the silicon oxide layer.

12. The method of claim 11, further comprising removing an upper portion of the isolation layer after forming the etch stop layer pattern to partially expose the preliminary floating gate.

13. The method of claim 12, wherein removing the upper portion of the isolation layer comprises removing the upper portion of the isolation layer until a top surface of the isolation layer has a height substantially the same as that of a lowermost point of the etch stop layer pattern.

14. The method of claim 12, wherein removing the upper portion of the isolation layer comprises removing the upper portion of the isolation layer until a top surface of the isolation layer has a height substantially the same as or higher than that of a lowermost point of the preliminary floating gate.

15. A method of manufacturing a semiconductor memory device, comprising:

forming an isolation layer in a substrate adjacent an active region in the substrate;

forming a tunnel insulation layer on the active region;

forming a preliminary floating gate layer on the tunnel insulation layer and on the isolation layer;

forming an etch stop layer on the preliminary floating gate layer;

forming a sacrificial layer on the etch stop layer;

removing portions of the sacrificial layer, the etch stop layer and the preliminary floating gate layer to expose the isolation layer and to form a preliminary floating gate pattern on the tunnel insulation layer;

isotropically etching the preliminary floating gate pattern to form a floating gate having a substantially uniform thickness;

removing the etch stop layer;

forming a dielectric layer on the floating gate; and forming a control gate on the dielectric layer.

* * * * *